United States Patent
Lee et al.

(10) Patent No.: US 9,231,167 B2
(45) Date of Patent: Jan. 5, 2016

(54) INSULATION STRUCTURE FOR HIGH TEMPERATURE CONDITIONS AND MANUFACTURING METHOD THEREOF

(71) Applicants: Young Ki Lee, Seoul (KR); Seog Moon Choi, Seoul (KR); Sang Hyun Shin, Gyunggi-do (KR)

(72) Inventors: Young Ki Lee, Seoul (KR); Seog Moon Choi, Seoul (KR); Sang Hyun Shin, Gyunggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/555,186

(22) Filed: Nov. 26, 2014

(65) Prior Publication Data

US 2015/0084089 A1    Mar. 26, 2015

Related U.S. Application Data

(60) Continuation of application No. 13/177,276, filed on Jul. 6, 2011, now abandoned, which is a division of application No. 11/723,236, filed on Mar. 19, 2007, now Pat. No. 7,998,879.

(30) Foreign Application Priority Data

Mar. 20, 2006    (KR) .................. 10-2006-0025454

(51) Int. Cl.
| | |
|---|---|
| H01L 29/207 | (2006.01) |
| H01L 33/48 | (2010.01) |
| H05K 3/28 | (2006.01) |
| H01L 33/62 | (2010.01) |
| H01L 33/60 | (2010.01) |

(52) U.S. Cl.
CPC .............. *H01L 33/486* (2013.01); *H01L 33/62* (2013.01); *H05K 3/28* (2013.01); *H01L 33/60* (2013.01); *H05K 2203/0315* (2013.01); *H05K 2203/0542* (2013.01)

(58) Field of Classification Search
None
See application file for complete search history.

(56) References Cited

U.S. PATENT DOCUMENTS

| | | | |
|---|---|---|---|
| 5,414,543 | A | 5/1995 | Jang et al. |
| 6,372,608 | B1 | 4/2002 | Shimoda et al. |
| 6,645,830 | B2 | 11/2003 | Shimoda et al. |
| RE38,466 | E | 3/2004 | Inoue et al. |

(Continued)

FOREIGN PATENT DOCUMENTS

| | | |
|---|---|---|
| CN | 1717964 A | 1/2006 |
| JP | 06-120368 | 4/1994 |

(Continued)

OTHER PUBLICATIONS

Japanese Office Action, with English translation, issued in Japanese Patent Application No. 2007-069924, dated Sep. 14, 2010.

(Continued)

*Primary Examiner* — Jack Chen
(74) *Attorney, Agent, or Firm* — McDermott Will & Emery LLP

(57) ABSTRACT

An insulation structure for high temperature conditions and a manufacturing method thereof. In the insulation structure, a substrate has a conductive pattern formed on at least one surface thereof for electrical connection of a device. A metal oxide layer pattern is formed on a predetermined portion of the conductive pattern by anodization, the metal oxide layer pattern made of one selected from a group consisting of Al, Ti and Mg.

8 Claims, 5 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,169,707 B2 | 1/2007 | Maeng et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2002/0001177 A1 | 1/2002 | Petitbon |
| 2006/0118905 A1 | 6/2006 | Himori et al. |

FOREIGN PATENT DOCUMENTS

| | | |
|---|---|---|
| JP | 07-111297 | 4/1995 |
| JP | 2006-066859 A | 3/2006 |

OTHER PUBLICATIONS

Japanese Office Action, with English translation, issued in Japanese Patent Application No. 2007-069924, dated Mar. 2, 2010.
Chinese Office Action, with English translation, issued in Chinese Patent Application No. CN 200710087206.2, dated Jan. 23, 2009.
Korean Office Action issued in Korean Patent Application No. KR 10-2006-0025454, Mailed Apr. 25, 2007.
U.S. Office Action issued in U.S. Appl. No. 13/177,276 dated Aug. 29, 2014.
U.S. Office Action issued in U.S. Appl. No. 13/177,276 dated May 12, 2014.

INSULATION STRUCTURE FOR HIGH TEMPERATURE CONDITIONS AND MANUFACTURING METHOD THEREOF

CROSS-REFERENCE TO RELATED APPLICATIONS

This application is a Continuation of U.S. application Ser. No. 13/177,276 filed Jul. 6, 2011, entitled "INSULATION STRUCTURE FOR HIGH TEMPERATURE CONDITIONS AND MANUFACTURING METHOD THEREOF" which is a Divisional of U.S. application Ser. No. 11/723,236, filed on Mar. 19, 2007, now U.S. Pat. No. 7,998,879 which claims the benefit of Korean Patent Application No. 2006-25454 filed on Mar. 20, 2006, in the Korean Intellectual Property Office, the disclosure of which is incorporated herein by reference.

BACKGROUND OF THE INVENTION

1. Field of the Invention

The present invention relates to an insulation structure for high temperature conditions and a manufacturing method thereof, and more particularly, to an insulation structure in which a metal oxide in place of a conventional epoxy resin is employed as an insulation layer through anodization, thereby suitable for subsequent high temperature conditions, and a manufacturing method thereof.

2. Description of the Related Art

Various substrates or packages for current use are bonded to another substrate or package by employing solder paste, conductive paste or thermal eutectic method. Here, an electrical insulating layer (solder resist or insulation film) is formed on a conductive material to prevent the paste or conductive material from being electrically connected to other conductive parts.

Conventionally, in order to electrically insulate the substrate or package, a solder resist is formed through a liquid epoxy resin or film which responds to light. FIG. 1 illustrates a conventional process of forming such a solder resist. As shown in FIG. 1, conventionally, a resin 5 for forming a solder resist is applied on both surfaces of a substrate 1 each having a predetermined pattern 3. Then, the resin 5 is exposed, developed and cured to form a desired solder resist pattern.

But the solder resist as an insulating material is thermally weak. Thus, in high temperature conditions necessary for manufacturing the package these days, the solder resist suffers delamination due to thermal transformation, thereby undermining reliability of the substrate. Also, a general epoxy material exhibits high heat resistance, thus inadequate for dissipating heat from a device.

SUMMARY OF THE INVENTION

The present invention has been made to solve the foregoing problems of the prior art and therefore an aspect of the present invention is to provide an insulation structure in which an adodizable metal such as Al is deposited by PVD for electrical insulation and transformed into a non-conductive material through anodization to be employed as an insulation layer, thereby overcoming conventional problems associated with high temperature conditions, and a manufacturing method thereof.

According to an aspect of the invention, the insulation structure for high temperature conditions includes a substrate having a conductive pattern formed on at least one surface thereof for electrical connection of a device; and a metal oxide layer pattern formed on a predetermined portion of the conductive pattern by anodization, the metal oxide layer pattern comprising one selected from a group consisting of Al, Ti and Mg.

According to another aspect of the invention, the method for manufacturing the insulation structure for high temperature conditions includes:

preparing a substrate having a conductive pattern formed on at least one surface thereof for electrical connection of a device;

depositing a metal selected from a group consisting of Al, Ti and Mg on the substrate with the conductive pattern formed thereon by PVD to form a metal deposition layer;

oxidizing the metal deposition layer by anodization to form a metal oxide layer;

applying a photosensitive film on the metal oxide layer, and exposing and developing the photosensitive film to form a plurality of photosensitive film patterns and exposing the metal oxide layer between the plurality of the photosensitive film patterns; and removing the metal oxide layer exposed between the plurality of the photosensitive film patterns by etching a surface of the substrate using the photosensitive film pattern as a mask, thereby forming a metal oxide layer pattern on the entirety of, or in part of, the conductive pattern.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
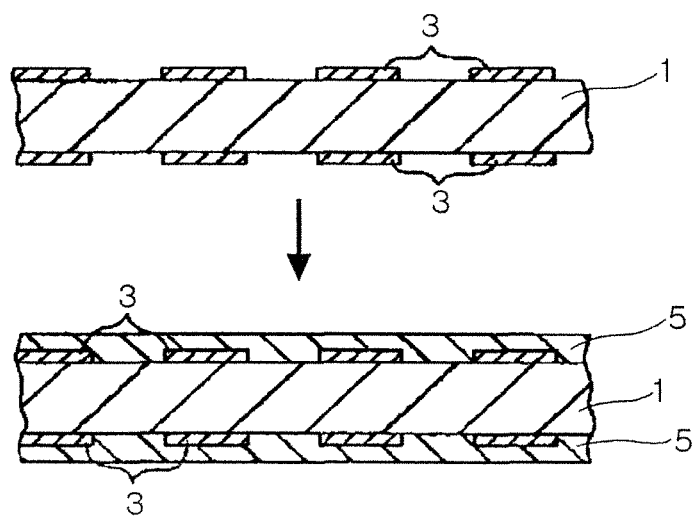
FIG. 1 illustrates a conventional method for manufacturing an insulation structure which adopts a solder resist as an insulating layer.
Figure 2:
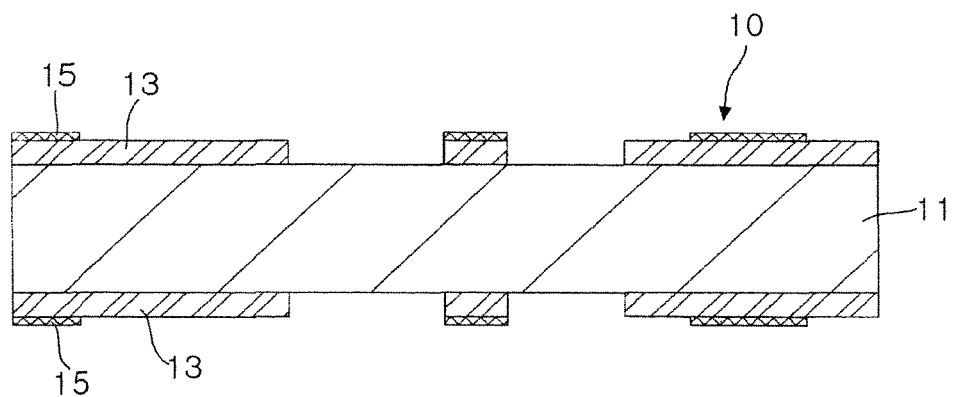
FIG. 2 is a schematic view illustrating an insulation structure according to an embodiment of the invention.

FIG. 2 is a schematic cross-sectional view illustrating an insulation structure according to an embodiment of the invention. As shown in FIG. 2, the insulation structure 10 includes a substrate 11 and a metal oxide layer pattern 15. The substrate 11 has conductive patterns formed on both surfaces thereof to electrically connect a device. The metal oxide layer pattern 15 is formed on a predetermined portion of the conductive pattern 13 by anodization and made of one selected from a group consisting of Al, Ti and Mg.

In this invention, the substrate 11 may have a conductive pattern formed on only one surface thereof, and the substrate of the invention is not limited to a particular kind. For example, the substrate 11 may be made of an epoxy resin or an oxide. Alternatively, the substrate 11 may be an insulating layer of a general printed circuit board (PCB). Alternatively, the substrate 11 may be a metal substrate made of e.g., Si.

Moreover, in this invention, the conductive pattern 13 for electrically connecting the device denotes a metal pattern in use for electric connections in a substrate, a package or a similarly-functioning structure for general use. However, the metal of invention is not limited to a specific kind.

Preferably, the conductive pattern 13 is made of a metal selected from a group consisting of Al, Ag, Cu, Pt, Au and Ni. Also, according to the invention, preferably, the device is either a power chip or a light emitting diode (LED).

Furthermore, the insulation structure 10 of the invention has the metal oxide layer pattern 15, i.e., insulating layer formed on a predetermined portion of the conductive pattern by anodization. Here, preferably, one selected from a group consisting of Al, Ti and Mg is anodized to form the metal oxide layer 15.

What is more, the insulation structure of the invention may include an upper substrate provided on the metal oxide layer pattern 15. In a case where the device is a light emitting diode, the upper substrate is preferably configured as a reflector or a reflecting plate.

Preferably, the upper substrate and the oxide layer pattern 15 are bonded together by eutectic bonding. More preferably, the upper substrate and the oxide layer pattern 15 are bonded together by Au/Sn eutectic bonding.

Then, an explanation will be given about a method for manufacturing an insulation structure of the invention.

Figure 3A:
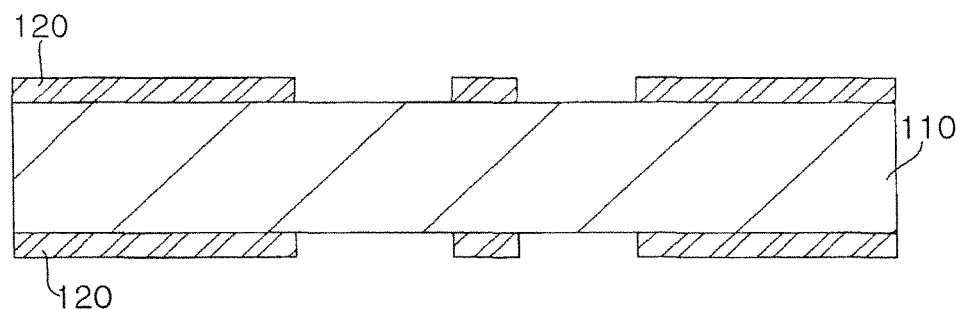
FIGS. 3a to 3f illustrate a method for manufacturing an insulation structure according to another embodiment of the invention.
Figure 3B:
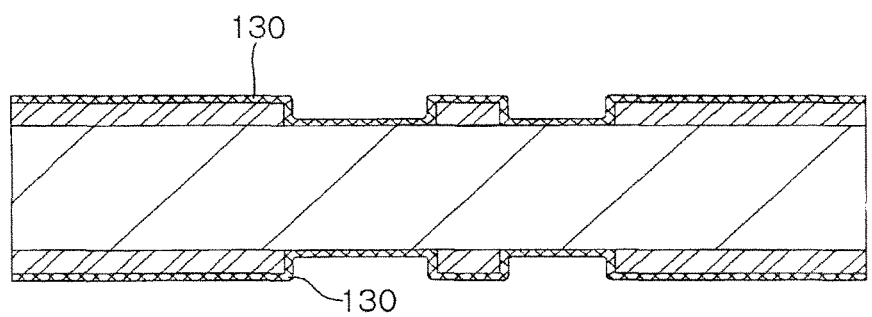
Figure 3C:
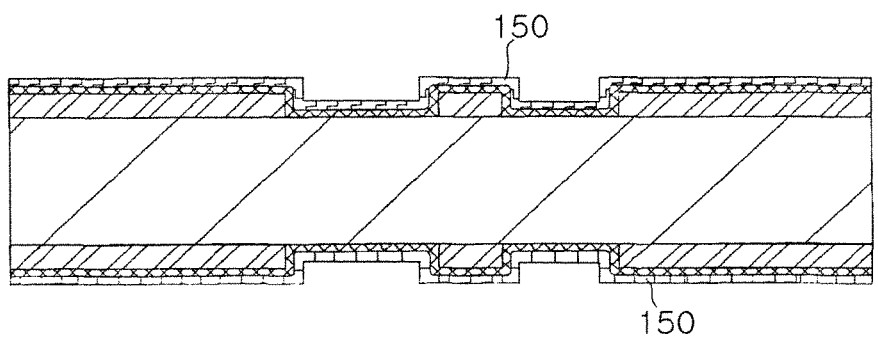
Figure 3D:
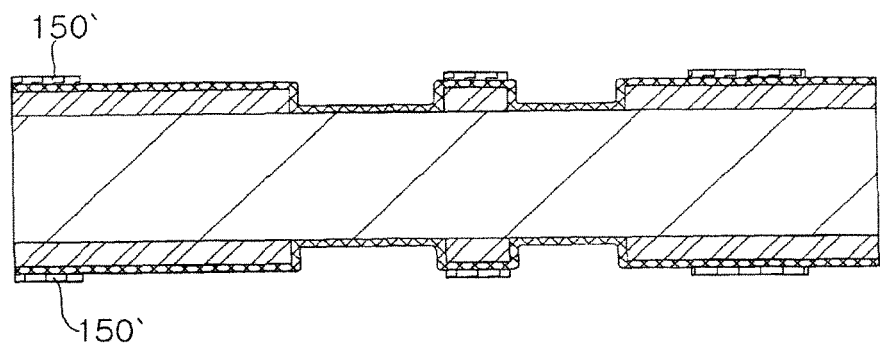
Figure 3E:
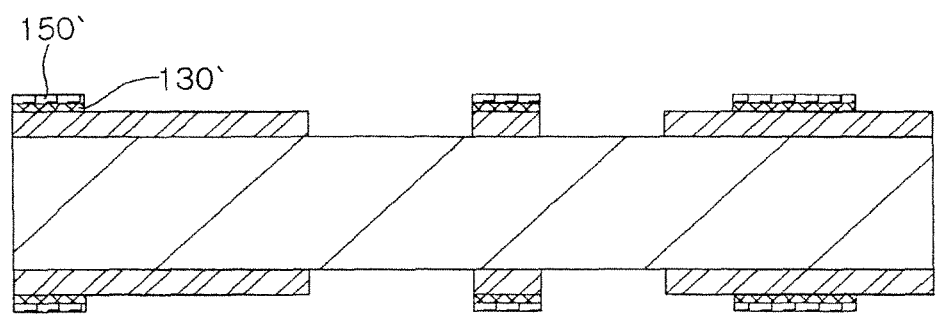
Figure 3F:
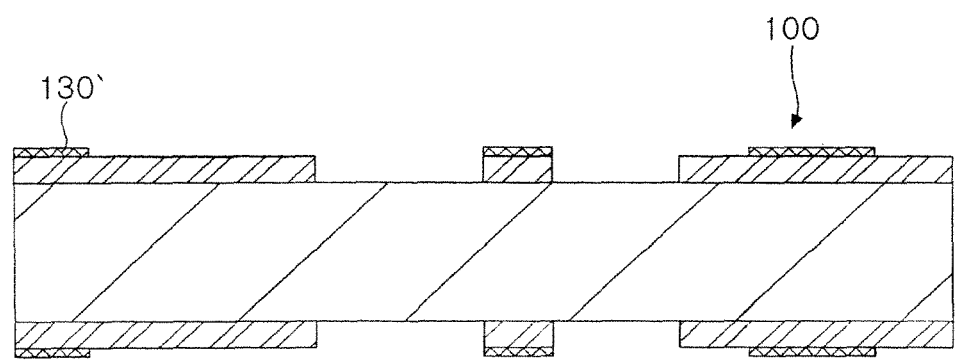

FIGS. 3a and 3f illustrate a method for manufacturing an insulation structure according to an embodiment of the invention.

As shown in 3(a), according to the invention, first, a substrate 110 with a conductive pattern 120 formed on at least one surface thereof is prepared to electrically connect a device. As described above, the substrate 110 of the invention is not limited to a particular kind, but all kinds of the substrate are adoptable as long as the conductive layer pattern can be formed on at least one surface thereof. Moreover, the conductive pattern 120 can be composed as described above. Also, according to the invention, preferably, the device is either a power chip or a light emitting diode.

Next, according to the invention, a metal selected from a group consisting of Al, Ti and Mg is deposited by PVD on the substrate with the conductive pattern 120 thereon to form a metal deposition layer. Such a metal is easily anodizable in a following process.

Meanwhile, the invention is not limited to a type of the PVD process and a specific process condition thereof. But preferably, the metal is deposited by sputtering or evaporation.

Subsequently, according to the invention, the metal deposition layer on the substrate is oxidized by general anodization, and thus transformed into a metal oxide layer 130 as shown in FIG. 3(b). In this fashion, the metal oxide layer 130 can be obtained by general anodization. That is, the substrate with the metal deposition layer formed thereon is immersed in an electrolytic bath and electrolytically reacted as an anode.

Then according to the invention, as shown in FIG. 3(c), a photosensitive film 150 is applied on the metal oxide layer 130, and exposed and developed to form a photosensitive film pattern 150' as shown in FIG. 3(d).

Afterwards, as shown in FIG. 3(e), a surface of the substrate with the photosensitive film pattern 150' thereon is etched to remove the metal oxide layer 130. According to the invention, the etching of the invention is exemplified by a general chemical etching but not limited thereto.

Next as shown in FIG. 3(f), the photosensitive film pattern 150' is removed to produce an insulation structure 100 with the metal oxide layer pattern 130' formed on a predetermined portion of the conductive pattern 120.

In addition, according to the invention, the insulation structure may include an upper substrate (not illustrated) attached onto the metal oxide layer pattern 130'. In a case where the device is a light emitting diode, the upper substrate is preferably configured as a reflecting plate.

Preferably, the upper substrate and the oxide layer pattern 130' are bonded together by eutectic bonding. More preferably, the upper substrate and the oxide layer pattern 130' are bonded together by Au/Sn eutectic bonding.

The insulation structure of the invention as described above ensures effective insulating characteristics when used to connect devices with one another in a high temperature Wafer Level Package (WLP) process. Also, the insulation structure of the invention effectively overcomes problems associated with conventional use of epoxy resin as an insulating layer.

The invention will be explained in detail by way of example.

EXAMPLE

A Si substrate with a copper conductive pattern formed on both surfaces thereof was prepared. Then Al was sputtered on the substrate to form an Al deposition layer. Thereafter, the Al deposition layer was transformed into an $Al_2O_3$ oxide layer using typical anodization, and a photosensitive film was applied on the oxide layer. Subsequently, the photosensitive film was exposed and developed to form a pattern and a surface of the $Al_2O_3$ oxide layer was etched to form an $Al_2O_3$ oxide layer pattern on the conductive pattern. Next, the upper substrate was bonded onto the $Al_2O_3$, oxide layer pattern, i.e., insulation layer by Au/Sn eutectic bonding in a high temperature WLP process.

Figure 4:
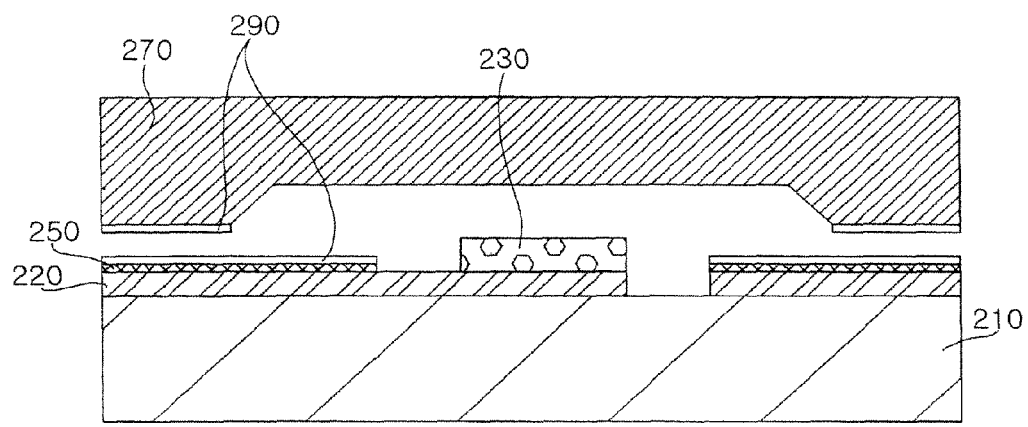
FIG. 4 is a schematic view illustrating an electrical connection of devices in a wafer level package (NLP) process using the insulation structure of the invention.

FIG. 4 is a schematic view illustrating an electrical connection of a device using an insulation structure of the invention in a high temperature WLP process. As shown in FIG. 4, reference numeral 210 denotes a base wafer where the device is formed or mounted. Reference numeral 220 denotes a conductive pattern, reference numeral 230 denotes a device, reference numeral 250 denotes an $Al_2O_3$ oxide layer pattern, reference numeral 270 denotes an upper substrate (a wafer for the upper package), and reference numeral 290 denotes a bonding layer for eutectic bonding.

However, in case of bonding in this wafer level package process, the device is electrically connected through a layer which electrically insulates the bonding layer 290 from conductive lines. In this example, the $Al_2O_3$ oxide layer 250 is adopted for the insulation layer. This effectively eliminates problems, such as gas occurrence and thermal deformation, associated with eutectic bonding in the conventional WLP process where an epoxy layer is used as the insulation layer.

Figure 5:
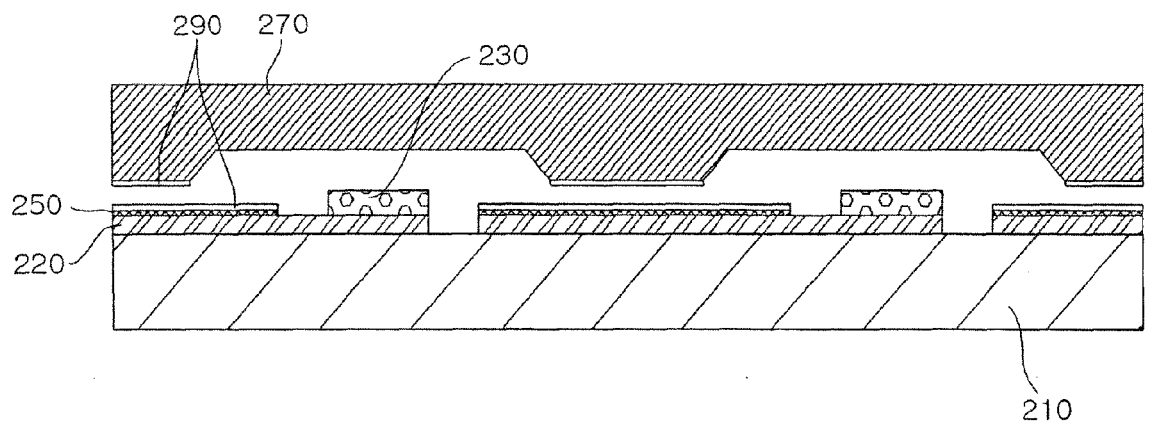
FIG. 5 illustrates a successive arrangement of those structures as shown in FIG. 4.

FIG. 5 illustrates a successive arrangement of those structures as shown in FIG. 4.

Figure 6:
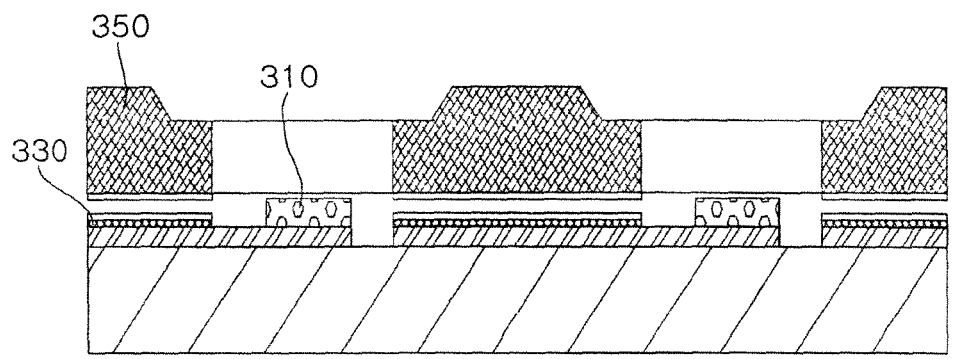
FIG. 6 is a schematic view illustrating a successive arrangement of an electrical connection of LEDs using the insulation structure of the invention.

Meanwhile, FIG. 6 illustrates LEDs 310 mounted on the conductive pattern. Here, a reflecting plate 350 is eutectically bonded onto an $Al_2O_3$ oxide layer 330.

As set forth above, according to exemplary embodiments of the invention, a metal oxide layer is formed by anodization to be utilized as an insulation layer. This solves problems with conventional use of an epoxy insulation layer, i.e., limitations experienced during high temperature conditions or the formation of a microstructure pattern. Also, unlike the conventional method based on low temperature conditions, the invention enables high temperature conditions of at least 300☐ and the insulation layer is sufficiently adjustable in its thickness in accordance with electrical properties. In addition, the metal oxide insulation layer formed by anodization is improved in heat transfer properties over the conventional one, thereby effectively dissipating heat from a heat generating device.

While the present invention has been shown and described in connection with the preferred embodiments, it will be apparent to those skilled in the art that modifications and variations can be made without departing from the spirit and scope of the invention as defined by the appended claims.

What is claimed is:

1. An insulation structure for high temperature conditions comprising:
    a substrate;
    a conductive pattern disposed on the substrate and having an upper surface divided into a first region and a second region, the conductive pattern partially exposes an upper surface of the substrate; and
    a metal oxide layer pattern disposed on the first region of the conductive pattern, the metal oxide layer pattern exposes an upper surface of the second region of the conductive pattern,
    wherein:
    a lower surface of the metal oxide layer pattern contacts an upper surface of the first region of the conductive pattern,
    the upper surface of the second region of the conductive pattern exposed externally from the metal oxide layer pattern provides a mounting area, and
    the metal oxide layer pattern is made of one selected from a group consisting of anodized Al, anodized Ti, and anodized Mg.

2. The insulation structure according to claim 1, further comprising an electrical device mounted on the mounting area electrically connected to the second region of the conductive pattern.

3. The insulation structure according to claim 2, wherein the electrical device is separated from the metal oxide layer pattern contacting the second region of the conductive pattern.

4. The insulation structure according to claim 2, wherein the electrical device comprises a power chip or a light emitting diode.

5. The insulation structure according to claim 1, wherein the substrate is a Si substrate.

6. The insulation structure according to claim 1, further comprising an upper substrate bonded to the metal oxide layer pattern through a eutectic bonding layer.

7. The insulation structure according to claim 6, wherein the eutectic bonding layer is an Au/Sn eutectic bonding layer.

8. The insulation structure according to claim 1, further comprising an electrical device on the second region of the conductive pattern.

* * * * *